(12) United States Patent
Kuo et al.

(10) Patent No.: US 12,308,076 B2
(45) Date of Patent: May 20, 2025

(54) MEMORY DEVICE AND ERASING METHOD THEREOF

(71) Applicant: Winbond Electronics Corp., Taichung (TW)

(72) Inventors: Ying-Shan Kuo, Hsinchu County (TW); Lung-Chi Cheng, Hsinchu County (TW); Ju-Chieh Cheng, Taichung (TW)

(73) Assignee: Winbond Electronics Corp., Taichung (TW)

( * ) Notice: Subject to any disclaimer, the term of this patent is extended or adjusted under 35 U.S.C. 154(b) by 183 days.

(21) Appl. No.: 18/312,037

(22) Filed: May 4, 2023

(65) Prior Publication Data

US 2024/0290400 A1    Aug. 29, 2024

(30) Foreign Application Priority Data

Feb. 23, 2023  (TW) .................................. 112106690

(51) Int. Cl.
  *G11C 16/16* (2006.01)
  *G11C 16/14* (2006.01)
  *G11C 16/34* (2006.01)

(52) U.S. Cl.
  CPC .......... *G11C 16/3445* (2013.01); *G11C 16/14* (2013.01); *G11C 16/16* (2013.01); *G11C 16/3477* (2013.01)

(58) Field of Classification Search
  CPC . G11C 16/3445; G11C 16/14; G11C 16/3477; G11C 16/16
  See application file for complete search history.

(56) References Cited

U.S. PATENT DOCUMENTS 6,331,951 B1 * 12/2001 Bautista, Jr. ....... G11C 16/3445
                                                      365/185.29
6,377,488 B1 *  4/2002 Kim .................. G11C 16/3468
                                                      365/185.29
(Continued)

FOREIGN PATENT DOCUMENTS

CN              1615525 A      5/2005
CN            109872759 A      6/2019
(Continued)

*Primary Examiner* — Jay W. Radke
(74) *Attorney, Agent, or Firm* — Birch, Stewart, Kolasch & Birch, LLP

(57) ABSTRACT

An erasing method of a memory device includes the following steps. It is determined whether a memory passes the first erasing verification operation according to the first erasing verification threshold. When the memory does not pass the first erasing verification operation, an erasing operation is performed on the memory. When the memory passes the first erasing verification operation, a flag is generated and it is determined whether the memory passes a second erasing verification operation according to the second erasing verification threshold. When the memory does not pass the second erasing verification operation, the erasing operation is performed on the memory. When the memory passes the second erasing verification operation, an over-erase correction is performed on the memory. It is determined whether there is a flag indicating that all addresses pass the first erasing verification to determine whether the memory passes the first or second erasing verification operation.

14 Claims, 5 Drawing Sheets

(56) References Cited

U.S. PATENT DOCUMENTS

| | | | |
|---|---|---|---|
| 10,580,505 B1 | 3/2020 | Chen | |
| 10,825,529 B2 | 11/2020 | Hsu et al. | |
| 2004/0125656 A1* | 7/2004 | Mizoguchi | G11C 16/344 |
| | | | 365/185.29 |
| 2006/0034128 A1* | 2/2006 | Han | G11C 16/0483 |
| | | | 365/189.12 |
| 2007/0076465 A1 | 4/2007 | Chen et al. | |
| 2007/0103974 A1* | 5/2007 | Takeguchi | G11C 16/3445 |
| | | | 365/185.3 |
| 2012/0206972 A1* | 8/2012 | Shiino | G11C 16/345 |
| | | | 365/185.22 |
| 2017/0092372 A1* | 3/2017 | Yang | G11C 16/04 |
| 2017/0200506 A1* | 7/2017 | Shim | G11C 16/0483 |
| 2019/0139615 A1* | 5/2019 | Ku | G11C 16/3445 |
| 2019/0378574 A1* | 12/2019 | Lee | G11C 11/5635 |
| 2020/0411105 A1* | 12/2020 | Lee | G11C 16/3445 |
| 2023/0186997 A1* | 6/2023 | Yano | G11C 16/3445 |
| 2023/0268012 A1* | 8/2023 | Igarashi | G11C 16/14 |

FOREIGN PATENT DOCUMENTS

| | | |
|---|---|---|
| CN | 113360421 A | 9/2021 |
| EP | 0 900 440 B1 | 7/2003 |
| TW | 202219961 A | 5/2022 |

\* cited by examiner

MEMORY DEVICE AND ERASING METHOD THEREOF

CROSS REFERENCE TO RELATED APPLICATIONS

This application claims priority of Taiwan Patent Application No. 112106690, filed on Feb. 23, 2023, the entirety of which is incorporated by reference herein.

BACKGROUND OF THE INVENTION

Field of the Invention

An embodiment of the present invention relates to a memory device, and in particular it relates to a memory device and an erasing method thereof.

Description of the Related Art

Generally, flash memory includes a memory array, and the memory array includes a large number of storage cells, which are usually grouped into blocks. An erasing operation is usually performed on the flash memory according to the sequence of the addresses of the blocks.

However, erasing is very time-consuming when using the existing method of erasing flash memory. Moreover, the erasing efficiency is low, and the problem of cell leakage may occur. This does not meet the requirements on erasing memory. Therefore, the erasing design of the memory still needs to be improved.

BRIEF SUMMARY OF THE INVENTION

An embodiment of the present invention provides an erasing method of a memory device, which includes the following steps. It is determined whether a memory passes the first erasing verification operation according to the first erasing verification threshold. When the memory does not pass the first erasing verification operation, at least one erasing pulse corresponding to an erasing size is generated according to an erasing number, so as to perform an erasing operation on the memory. When the memory passes the first erasing verification operation, a flag is generated, wherein the flag indicates that all addresses have passed the first erasing verification, and it is determined whether the memory passes the second erasing verification operation according to the second erasing verification threshold. When the memory does not pass the second erasing verification operation, the at least one erasing pulse corresponding to the erasing size is generated according to the erasing number, so as to perform the erasing operation on the memory. When the memory passes the second erasing verification operation, an over-erase correction is performed on the memory. It is determined whether there is the flag indicating that all addresses have passed the first erasing verification. When there is no flag indicating that all addresses have passed the first erasing verification, the step of determining whether the memory passes the first erasing verification operation according to the first erasing verification threshold is performed. When there is the flag indicating that all addresses have passed the first erasing verification, the step of determining whether the memory passes the second erasing verification operation according to the second erasing verification threshold is performed.

The present invention provides a memory device, which includes a memory and an erasing module. The erasing module determines whether a memory passes the first erasing verification operation according to the first erasing verification threshold. When the memory does not pass the first erasing verification operation, the erasing module generates at least one erasing pulse corresponding to an erasing size according to an erasing number, so as to perform an erasing operation on the memory. When the memory passes the first erasing verification operation, the erasing module generates a flag, wherein the flag indicates that all addresses have passed the first erasing verification, and determines whether the memory passes the second erasing verification operation according to the second erasing verification threshold. When the memory does not pass the second erasing verification operation, the erasing module generates the at least one erasing pulse corresponding to the erasing size according to the erasing number, so as to perform the erasing operation on the memory. When the memory passes the second erasing verification operation, the erasing module performs an over-erase correction on the memory. The erasing module determines whether there is the flag indicating that all addresses have passed the first erasing verification. When there is no flag indicating that all addresses have passed the first erasing verification, the erasing module determines whether the memory passes the first erasing verification operation according to the first erasing verification threshold. When there is the flag indicating that all addresses have passed the first erasing verification, the erasing module determines whether the memory passes the second erasing verification operation according to the second erasing verification threshold.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
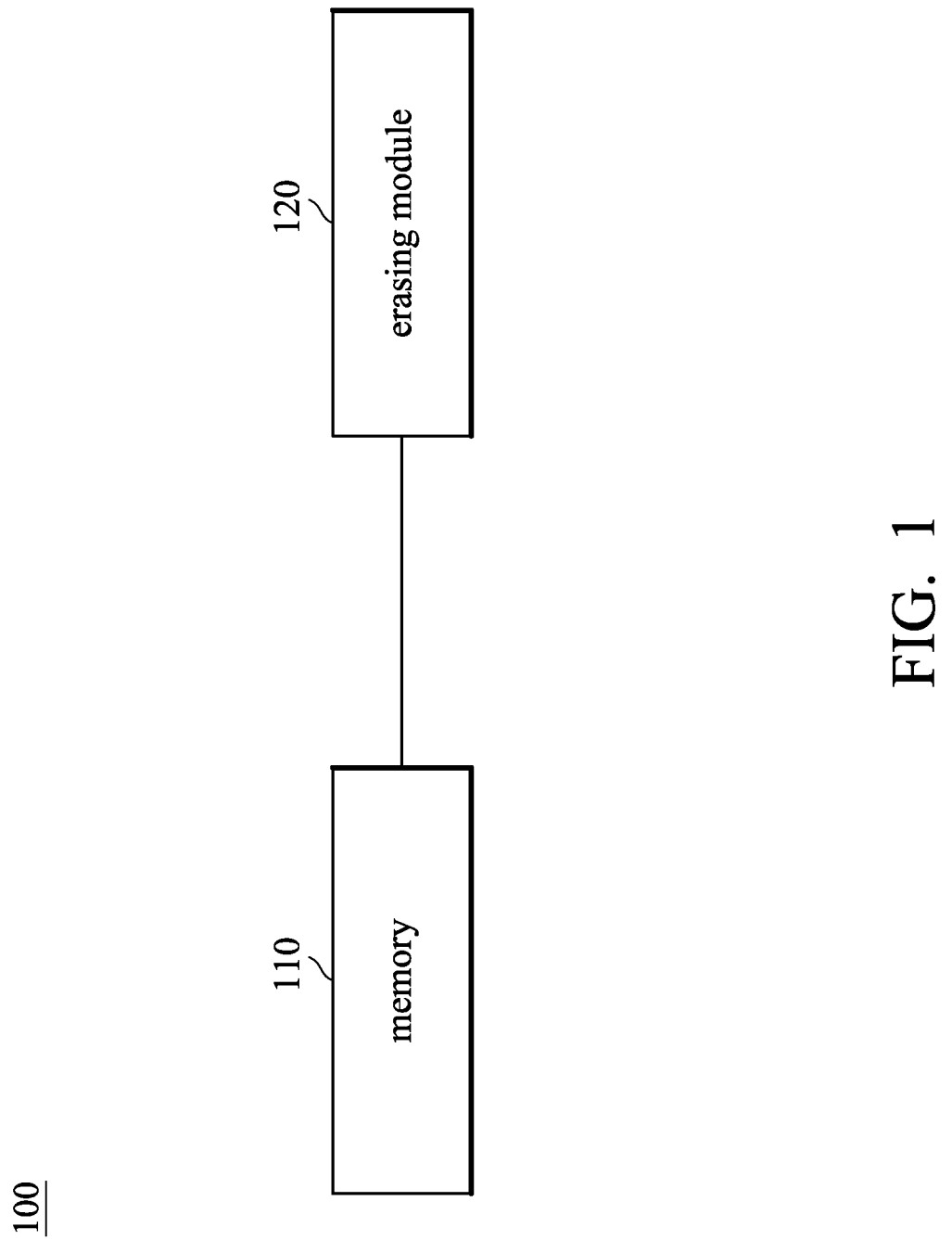
FIG. 1 is a schematic view of a memory device according to an embodiment of the present invention.

FIG. 1 is a schematic view of a memory device according to an embodiment of the present invention. Please refer to FIG. 1. The memory device 100 includes a memory 110 and an erasing module 120. In the embodiment, the memory 110 may be a flash memory, such as a NOR type flash memory. In addition, the memory 110 may have a storage array, and the storage array is, for example, divided into a plurality of blocks and each block may include a plurality of storage cells. The above blocks and the internal storage cells thereof are numbered sequentially to form the corresponding block addresses and the addresses of the storage cells within each block.

The erasing module 120 may determine whether a memory 110 passes the first erasing verification operation according to the first erasing verification threshold. For example, the erasing module 120 may start from the first address of the current block of the memory 110, and perform a first erasing verification on each address of the current block according to the first erasing verification threshold in order (i.e., the erasing module 120 compares the first erasing verification threshold with the current of each address of the current block), so as to determine whether the memory 110 passes the first erasing verification operation.

Furthermore, the erasing module 120 may determine whether the current address of the memory 110 passes the first erasing verification according to the first erasing verification threshold. When the current address of the memory 110 passes the first erasing verification, the erasing module 120 determines whether the current address of the memory 110 is a predetermined address. In the embodiment, the predetermined address may be a last address of the current block, such as the last address of 64 KB, but the present invention is not limited thereto. When the current address of the memory 110 is not the predetermined address, the erasing module 120 changes the current address to the next address, for example, the current address +1. Then, the erasing module 120 continues to determine whether the current address of the memory 110 passes the first erasing verification according to the first erasing verification threshold until the current address that passes the first erasing verification is the predetermined address. When the current address of the memory 110 is the predetermined address, the erasing module 120 generates a flag, wherein the flag indicates that all addresses have passed the first erasing verification. In an example, the erasing module 120 generates the flag such as a high logic level "1" to indicate that all first erasing verifications on the memory 110 have been completed.

When the current address of the memory 110 does not pass the first erasing verification, the erasing module 120 may generate at least one erasing pulse corresponding to an erasing size according to an erasing number, so as to perform the erasing operation on the memory 110. Furthermore, the erasing module 120 may determine whether the erasing number is lower than or equal to the first predetermined erasing number. In the embodiment, the maximum value of the erasing number is, for example, 1024, and the first predetermined erasing number is, for example, 32, but the present invention is not limited thereto. In addition, the first predetermined erasing number may also be, for example, 4, 8, 16, 64, 128, or 256. When the erasing number is lower than or equal to the first predetermined erasing number (such as 32), the erasing module 120 may generate a first erasing pulse corresponding to a first erasing size, so as to perform the erasing operation on the memory 110. In the embodiment, the first erasing size is, for example, 64 KB, but the present invention is not limited thereto. Then the erasing module 120 counts the first erasing pulse, so as to increase the erasing number, for example, the erasing number +1.

When the erasing number is not lower than or equal to the first predetermined erasing number (such as 32), the erasing module 120 determines whether the erasing number is lower than or equal to a second predetermined erasing number. In the embodiment, the second predetermined erasing number is, for example, greater than the first predetermined erasing number, and the second predetermined erasing number is, for example, 128, but the present invention is not limited thereto. In addition, the second predetermined erasing number may also be, for example, 8, 16, 64, 256, or 512.

When the erasing number (such as 33-128) is lower than or equal to the second predetermined erasing number (such as 128), the erasing module 120 generates a second erasing pulse corresponding to a second erasing size, so as to perform the erasing operation on the memory 110, and performs the over-erase correction on the memory 110. In the embodiment, the over-erase correction is, for example, a bit-by-bit recovery program, which may effectively improve the cell leakage correction, and increase the reliability and durability of the product. In the embodiment, the second erasing size is, for example, smaller than the first erasing size, and the second erasing size is, for example, 16 KB, but the present invention is not limited thereto. That is, in some embodiments, when the erasing number (such as 33-128) is lower than or equal to the second predetermined erasing number (such as 128), the erasing module 120 may adjust the erasing size from the first erasing size (such as 64 KB) to the second erasing size (16 KB), generates one second erasing pulse corresponding to the second erasing size (such as 16 KB), so as to perform the erasing operation on the memory 110, and performs the over-erase correction on the memory 110. Then, the erasing module 120 may count the second erasing pulse, so as to increase the erasing number, for example, the erasing number +1.

In addition, in some embodiments, when the erasing number (such as 33-128) is lower than or equal to the second predetermined erasing number (such as 128), the erasing module 120 may generate, for example, two second erasing pulses corresponding to the second erasing size (such as 16 KB), so as to perform the erasing operation on the memory 110, and perform the over-erase correction on the memory 110. Therefore, the erasing speed of the memory 110 by the erasing module 120 may be accelerated. Then, the erasing module 120 may count the second erasing pulse, so as to increase the erasing number, for example, the erasing number +2.

When the erasing number (such as 129-1023) is not lower than or equal to the second predetermined erasing number (such as 128), the erasing module 120 may generate a third erasing pulse corresponding to a third erasing size, so as to perform the erasing operation on the memory 110, and performs the over-erase correction on the memory 110. In the embodiment, the third erasing size is, for example, smaller than the second erasing size, and the third erasing size is, for example, 4 KB, but the present invention is not limited thereto. That is, when the erasing number (such as 129-1023) is not lower than or equal to the second predetermined erasing number (such as 128), the erasing module 120 may adjust the erasing size from the second erasing size (such as 16 KB) to the third erasing size (such as 4 KB), generate one third erasing pulse corresponding to the third erasing size (such as 4 KB), so as to perform the erasing operation on the memory 110, and perform the over-erase correction on the memory 110. Then, the erasing module 120 may count the third erasing pulse, so as to increase the erasing number, for example, the erasing number +1.

Afterward, the erasing module 120 may determine whether there is the flag indicating that all addresses have passed the first erasing verification. When there is no flag indicating that all addresses have passed the first erasing verification, the erasing module 120 may continue to determine whether the current address of the memory 110 passes the first erasing verification operation according to the first erasing verification threshold until all addresses have been passed the first erasing verification.

When there is the flag indicating that all addresses have passed the first erasing verification, the erasing module 120 may determine whether the memory 110 passes the second erasing verification operation according to the second erasing verification threshold. In the embodiment, the first erasing verification threshold is, for example, lower than the second erasing verification threshold. For example, the erasing module 120 may start from the first address of the current block of the memory 110, and perform the second erasing verification on each address of the current block according to the second erasing verification threshold in order (i.e., the erasing module 120 compares the second erasing verification threshold with the current of each address of the current block), so as to determine whether the memory 110 passes the second erasing verification operation.

Furthermore, the erasing module 120 may determine whether the current address of the memory 110 passes the second erasing verification according to the second erasing verification threshold. When the current address of the memory 110 does not pass the second erasing verification, the erasing module 120 may generate the at least one erasing pulse corresponding to the erasing size according to the erasing number, so as to perform the erasing operation on the memory 110. Here, the operation of the erasing module 120 determining that the current address of the memory 110 does not pass the second erasing verification is the same as the operation of the erasing module 120 determining that the memory 110 does not pass the first erasing verification, and the description thereof is not repeated herein. The difference is that when there is no flag indicating that all addresses have passed the first erasing verification, the erasing module 120 may perform the first erasing verification on the current address according to the first erasing verification threshold; when there is the flag indicating that all addresses have passed the first erasing verification, the erasing module 120 may perform the second erasing verification on the current address according to the second erasing verification threshold.

When the current address that passes the second erasing verification is the predetermined address, it indicates that all second erasing verifications of the erasing module 120 have been completed, and the erasing module 120 then performs the over-erase correction on the memory 110. Therefore, the cell leakage problems caused by the over-erasing may be prevented. After all the address of the current block are verified to be effectively erased and the over-erased addresses are corrected, the erasing operation of the current block of the memory 110 is completed.

In the embodiment, before the erasing module 120 determines whether the memory 110 passes the first erasing verification operation according to the first erasing verification threshold, the erasing module 120 further pre-programs the memory 110. For example, the erasing module 120 may pre-program the block to be erased in the memory 110 (i.e., the current block), so as to pre-program the threshold voltage of each storage cell in the memory 110 to a predetermined level and reset to the first address of the block to be erased, and reset the erasing number to 0, etc.

Figure 2:
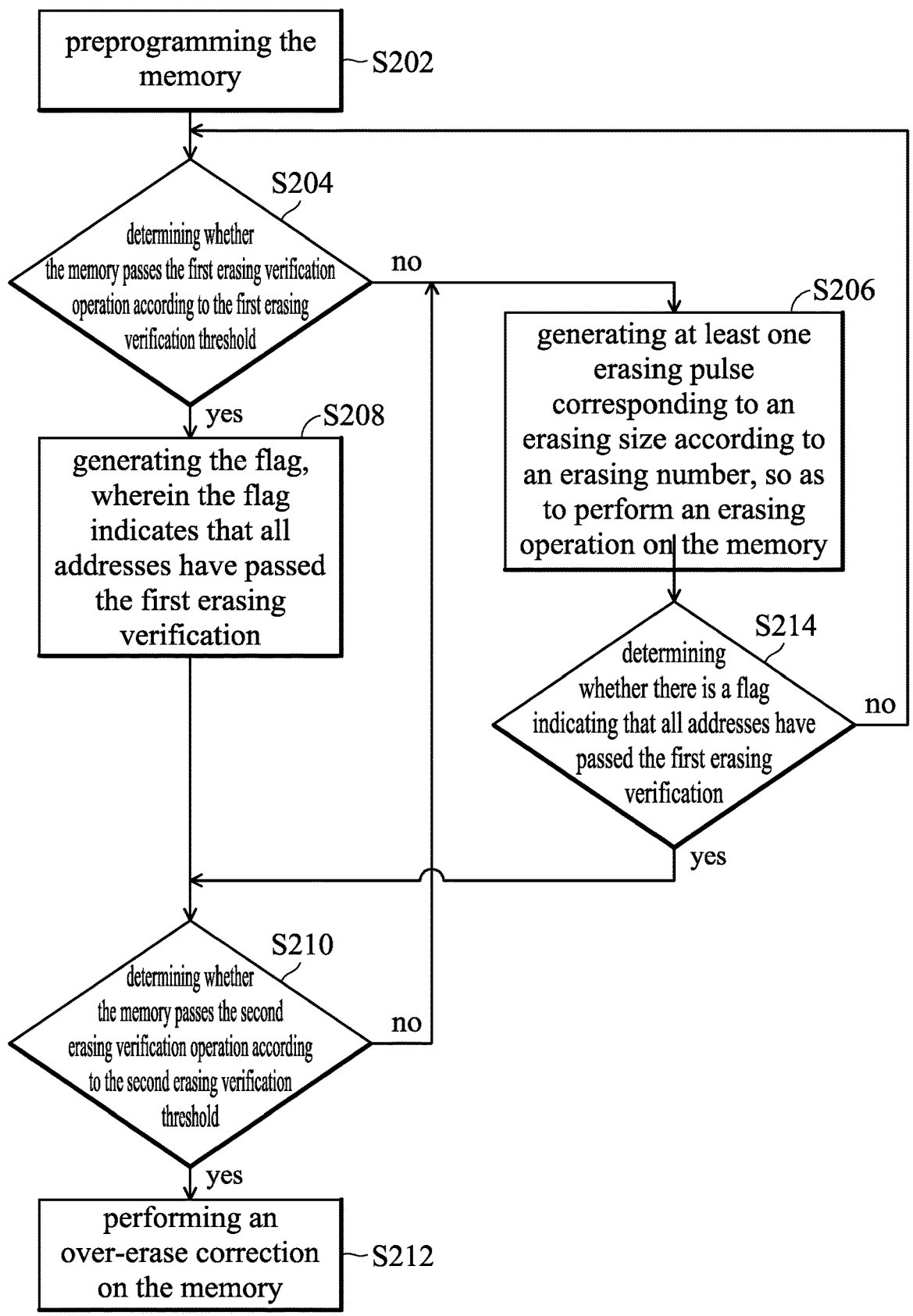
FIG. 2 is a flowchart of an erasing method of a memory device according to an embodiment of the present invention.

FIG. 2 is a flowchart of an erasing method of a memory device according to an embodiment of the present invention. In step S202, the method involves preprogramming the memory. In step S204, the method involves determining whether the memory passes the first erasing verification operation according to the first erasing verification threshold. When the memory does not pass the first erasing verification operation, the method performs step S206. In step S206, the method involves generating at least one erasing pulse corresponding to an erasing size according to an erasing number, so as to perform an erasing operation on the memory. Then, in step S214, the method involves determining whether there is a flag indicating that all addresses have passed the first erasing verification. When there is no flag indicating that all addresses have passed the first erasing verification, the method returns to step S204, and the method continues to determine whether a memory passes the first erasing verification operation according to the first erasing verification threshold. When there is the flag indicating that all addresses have passed the first erasing verification, the method performs step S210.

Returning to step S204, when the memory passes the first erasing verification operation, the method performs S208. In step S208, the method involves generating the flag, wherein the flag indicates that all addresses have passed the first erasing verification. Then, in step S210, the method involves determining whether the memory passes the second erasing verification operation according to the second erasing verification threshold. When the memory does not pass the second erasing verification operation, the method performs S206, and the method involves generating the at least one erasing pulse corresponding to the erasing size according to the erasing number, so as to perform the erasing operation on the memory. Then, in step S214, the method involves determining whether there is the flag indicating that all addresses have passed the first erasing verification. When there is no flag indicating that all addresses have passed the first erasing verification, the method returns to step S204. When there is the flag indicating that all addresses have passed the first erasing verification, the method performs S210, and the method continues to determine whether the memory passes the second erasing verification operation according to the second erasing verification threshold.

Returning to step S210, when the memory passes the second erasing verification operation, the method performs S212. In step S212, the method involves performing an over-erase correction on the memory. In the embodiment, the first erasing verification threshold is, for example, lower than the second erasing verification threshold.

Figure 3:
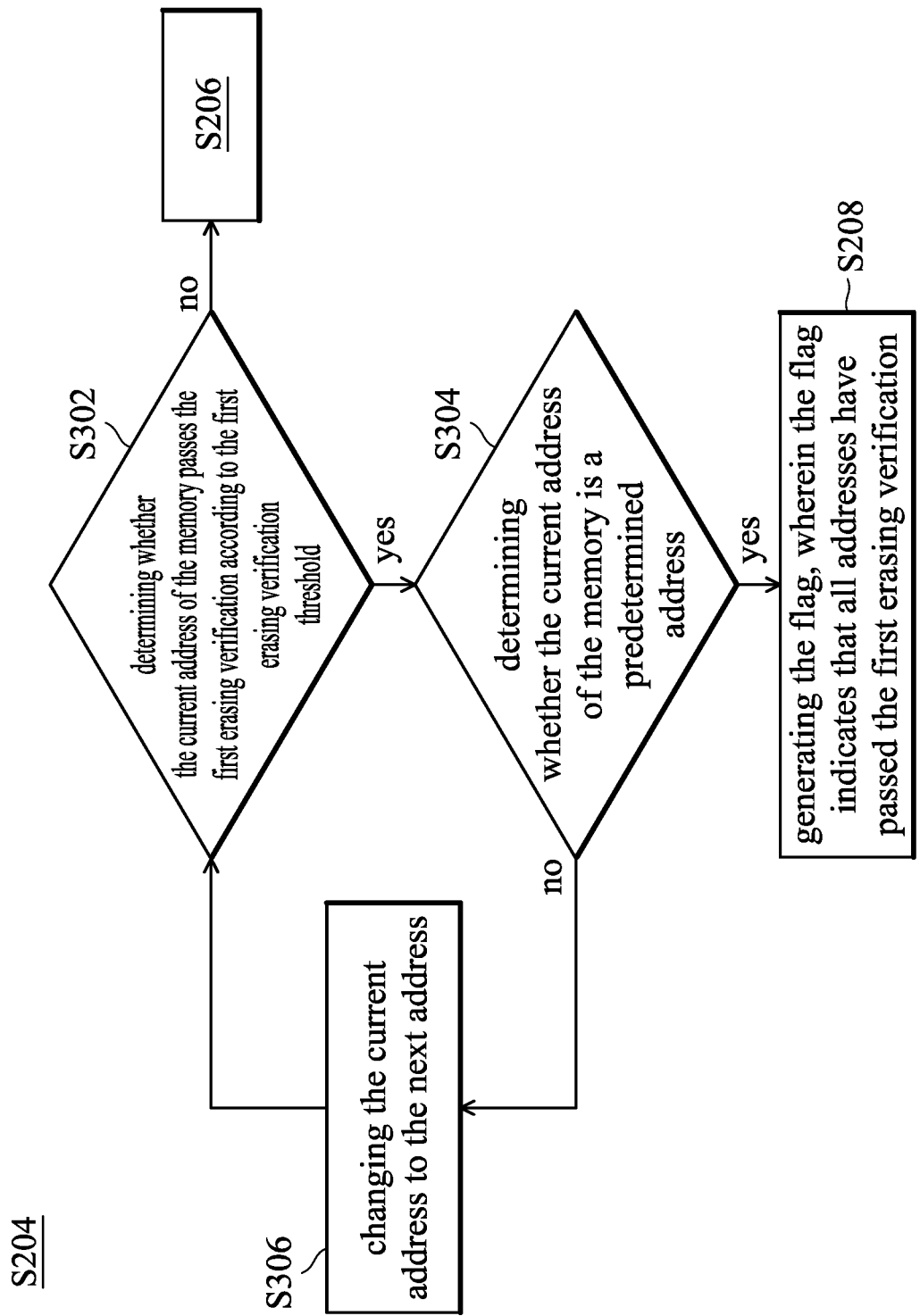
FIG. 3 is a detailed flowchart of step S204 in FIG. 2.

FIG. 3 is a detailed flowchart of step S204 in FIG. 2. In step S302, the method involves determining whether the current address of the memory passes the first erasing verification according to the first erasing verification threshold. When the current address of the memory does not pass the first erasing verification, the method performs 206, and the method involves generating the at least one erasing pulse corresponding to the erasing size according to the erasing number, so as to perform the erasing operation on the memory.

When the current address of the memory passes the first erasing verification, the method performs step S304. In step S304, the method involves determining whether the current address of the memory is a predetermined address. When the current address of the memory is not the predetermined address, the method performs step S306. In step S306, the method involves changing the current address to the next address, for example, the current address +1. Then, the method returns to step S302, and the method continue to determine whether the current address of the memory passes the first erasing verification according to the first erasing verification threshold until it is determined that the current address of the memory is the predetermined address. When the current address of the memory is the predetermined address, the method performs step S208, and the method involves generating the flag, wherein the flag indicates that all addresses have passed the first erasing verification.

Figure 4:
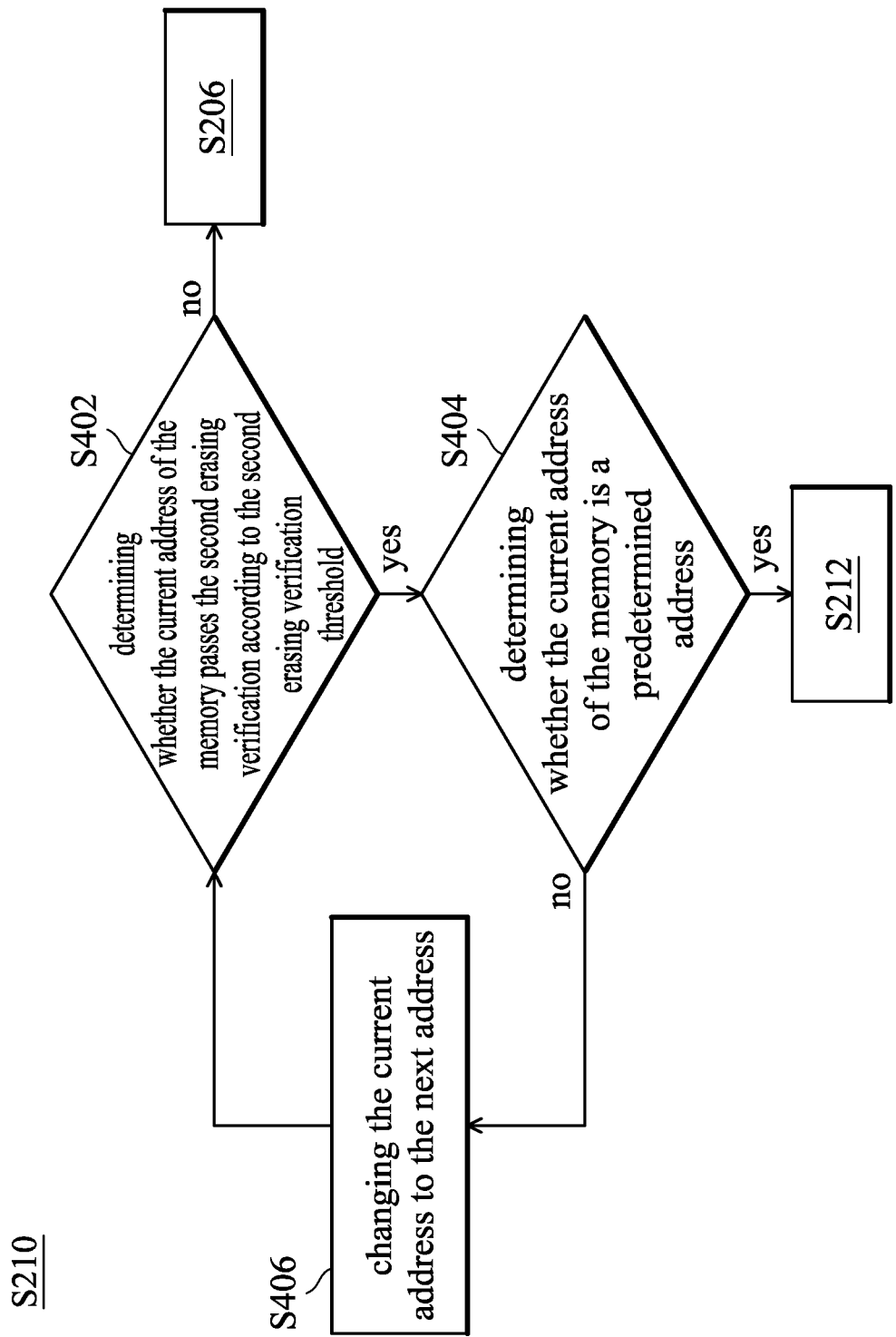
FIG. 4 is a detailed flowchart of step S210 in FIG. 2.

FIG. 4 is a detailed flowchart of step S210 in FIG. 2. In step S402, the method involves determining whether the current address of the memory passes the second erasing verification according to the second erasing verification threshold. When the current address of the memory does not pass the second erasing verification, the method performs S206, and the method involves generating the at least one erasing pulse corresponding to the erasing size according to the erasing number, so as to perform the erasing operation on the memory.

When the current address of the memory passes the second erasing verification, the method performs step S404. In step S404, the method involves determining whether the current address of the memory is a predetermined address. When the current address of the memory is not the predetermined address, the method performs step S406. In step S406, the method involves changing the current address to the next address, for example, the current address +1. Then, the method returns to step S402, and the method continue to determine whether the current address of the memory passes the second erasing verification according to the second erasing verification threshold until it is determined that the current address of the memory is the predetermined address. When the current address of the memory is the predetermined address, the method performs step S212, and the method involves performing the over-erase correction on the memory.

Figure 5:
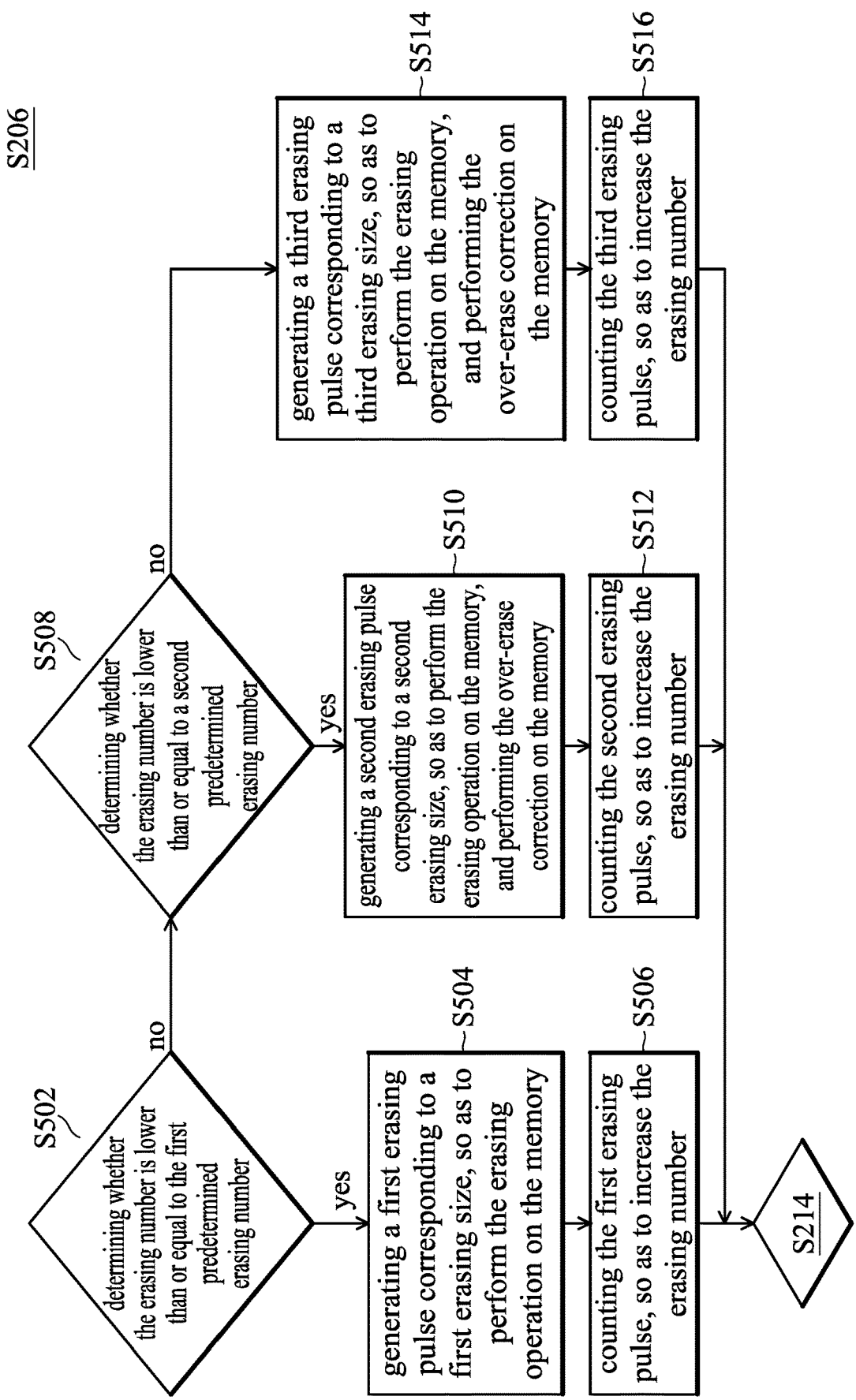
FIG. 5 is a detailed flowchart of step S206 in FIG. 2.

FIG. 5 is a detailed flowchart of step S206 in FIG. 2. In step S502, the method involves determining whether the erasing number is lower than or equal to the first predetermined erasing number. When the erasing number is lower than or equal to the first predetermined erasing number, the method performs S504. In step S504, the method involves generating a first erasing pulse corresponding to a first erasing size, so as to perform the erasing operation on the memory. In step S506, the method involves counting the first erasing pulse, so as to increase the erasing number.

When the erasing number is not lower than or equal to the first predetermined erasing number, the method performs step S508. In step S508, the method involves determining whether the erasing number is lower than or equal to a second predetermined erasing number. When the erasing number is lower than or equal to the second predetermined erasing number, the method performs step S510. In step S510, the method involves generating a second erasing pulse corresponding to a second erasing size, so as to perform the erasing operation on the memory, and performing the over-erase correction on the memory. In step S512, the method involves counting the second erasing pulse, so as to increase the erasing number.

When the erasing number is not lower than or equal to the second predetermined erasing number, the method performs step S514. In step S514, the method involves generating a third erasing pulse corresponding to a third erasing size, so as to perform the erasing operation on the memory, and performing the over-erase correction on the memory. In step S516, the method involves counting the third erasing pulse, so as to increase the erasing number. After step S506, step S512 or step S516 is performed, step S214 may be performed next. In the embodiment, the second erasing size is, for example, smaller than the first erasing size, and the third erasing size is, for example, smaller than the second erasing size. In addition, the second predetermined erasing number is greater than the first predetermined erasing number.

It is worth mentioning that as the erasing number increases, it may cause severe excessive erasure of the memory. In the present invention, in step S510 and step S514, when the erasing number of the memory is increased to be greater than the first predetermined erasing number, additional over-erase correction may be performed on the memory, so as to improve the reliability of the memory.

In summary, according to the memory device and the erasing method thereof disclosed by the embodiment of the present invention, it is determined whether the memory passes different erasing verification operations according to different erasing verification thresholds. When the memory does not pass the first erasing verification operation or the second erasing verification operation, the erasing pulses corresponding to the different erasing sizes are generated according to different erasing numbers, so as to the erasing operation on the memory. When the erasing number of the memory is greater than the first predetermined erasing number, the additional over-erase correction is performed on the memory. Therefore, the cell leakage correction may be improved, and the reliability and durability of the product are increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An erasing method of a memory device, comprising:
   determining whether a memory passes a first erasing verification operation according to a first erasing verification threshold;
   when the memory does not pass the first erasing verification operation, generating at least one erasing pulse, corresponding to an erasing size, according to an erasing number so as to perform an erasing operation on the memory;
   when the memory passes the first erasing verification operation, generating a flag, wherein the flag indicates that all addresses of the memory have passed a first erasing verification, and determining whether the memory passes a second erasing verification operation according to a second erasing verification threshold;
   when the memory does not pass the second erasing verification operation, generating the at least one erasing pulse, corresponding to the erasing size, according to the erasing number so as to perform the erasing operation on the memory;
   when the memory passes the second erasing verification operation, performing an over-erase correction on the memory;
   determining whether there is the flag indicating that all addresses of the memory have passed the first erasing verification;
   when there is no flag indicating that all addresses of the memory have passed the first erasing verification, performing the step of determining whether the memory passes the first erasing verification operation according to the first erasing verification threshold; and
   when there is the flag indicating that all addresses of the memory have passed the first erasing verification, performing the step of determining whether the memory passes the second erasing verification operation according to the second erasing verification threshold.

2. The erasing method of the memory device as claimed in claim 1, wherein the step of determining whether the memory passes the first erasing verification operation according to the first erasing verification threshold comprises:
   determining whether a current address of the memory passes the first erasing verification according to the first erasing verification threshold;

when the current address of the memory does not pass the first erasing verification, performing the step of generating the at least one erasing pulse, corresponding to the erasing size, according to the erasing number so as to perform the erasing operation on the memory;

when the current address of the memory passes the first erasing verification, determining whether the current address of the memory is a predetermined address;

when the current address of the memory is not the predetermined address, changing the current address to a next address, and performing the step of determining whether the current address of the memory passes the first erasing verification according to the first erasing verification threshold; and when the current address of the memory is the predetermined address, performing the step of generating the flag, wherein the flag indicates that all addresses of the memory have passed the first erasing verification.

3. The erasing method of the memory device as claimed in claim 1, wherein the step of determining whether the memory passes the second erasing verification operation according to the second erasing verification threshold comprises:

determining whether a current address of the memory passes a second erasing verification according to the second erasing verification threshold;

when the current address of the memory does not pass the second erasing verification, performing the step of generating the at least one erasing pulse, corresponding to the erasing size, according to the erasing number so as to perform the erasing operation on the memory;

when the current address of the memory passes the second erasing verification, determining whether the current address of the memory is a predetermined address;

when the current address of the memory is not the predetermined address, changing the current address to a next address, and performing the step of determining whether the current address of the memory passes the second erasing verification according to the second erasing verification threshold; and when the current address of the memory is the predetermined address, performing the step of performing the over-erase correction on the memory.

4. The erasing method of the memory device as claimed in claim 1, wherein the step of generating the at least one erasing pulse, corresponding to the erasing size, according to the erasing number so as to perform the erasing operation on the memory comprises:

determining whether the erasing number is lower than or equal to a first predetermined erasing number;

when the erasing number is lower than or equal to the first predetermined erasing number, generating a first erasing pulse corresponding to a first erasing size, so as to perform the erasing operation on the memory;

counting the first erasing pulse, so as to increase the erasing number;

when the erasing number is not lower than or equal to the first predetermined erasing number, determining whether the erasing number is lower than or equal to a second predetermined erasing number;

when the erasing number is lower than or equal to the second predetermined erasing number, generating a second erasing pulse corresponding to a second erasing size, so as to perform the erasing operation on the memory, and performing the over-erase correction on the memory;

counting the second erasing pulse, so as to increase the erasing number;

when the erasing number is not lower than or equal to the second predetermined erasing number, generating a third erasing pulse corresponding to a third erasing size, so as to perform the erasing operation on the memory, and performing the over-erase correction on the memory; and counting the third erasing pulse, so as to increase the erasing number.

5. The erasing method of the memory device as claimed in claim 4, wherein the second erasing size is smaller than the first erasing size, and the third erasing size is smaller than the second erasing size.

6. The erasing method of the memory device as claimed in claim 4, wherein the second predetermined erasing number is greater than the first predetermined erasing number.

7. The erasing method of the memory device as claimed in claim 1, wherein the first erasing verification threshold is lower than the second erasing verification threshold.

8. A memory device, comprising:

a memory; and an erasing module, configured to determine whether a memory passes a first erasing verification operation according to a first erasing verification threshold, when the memory does not pass the first erasing verification operation, the erasing module generates at least one erasing pulse, corresponding to an erasing size, according to an erasing number so as to perform an erasing operation on the memory, when the memory passes the first erasing verification operation, the erasing module generates a flag, wherein the flag indicates that all addresses of the memory have passed a first erasing verification, and determines whether the memory passes a second erasing verification operation according to a second erasing verification threshold, when the memory does not pass the second erasing verification operation, the erasing module generates the at least one erasing pulse, corresponding to the erasing size, according to the erasing number so as to perform the erasing operation on the memory, when the memory passes the second erasing verification operation, the erasing module performs an over-erase correction on the memory, the erasing module determines whether there is the flag indicating that all addresses of the memory have passed the first erasing verification, when there is no flag indicating that all addresses of the memory have passed the first erasing verification, the erasing module determines whether the memory passes the first erasing verification operation according to the first erasing verification threshold, and when there is the flag indicating that all addresses of the memory have passed the first erasing verification, the erasing module determines whether the memory passes the second erasing verification operation according to the second erasing verification threshold.

9. The memory device as claimed in claim 8, wherein the erasing module further determines whether a current address of the memory passes the first erasing verification according to the first erasing verification threshold; when the current address of the memory does not pass the first erasing verification, the erasing module generates the at least one erasing pulse, corresponding to the erasing size, according to the erasing number so as to perform the erasing operation on the memory; when the current address of the memory passes the first erasing verification, the erasing module determines whether the current address of the memory is a predetermined address; when the current address of the memory is not the predetermined address, the erasing module changes the current address to a next address, and determines whether the current address of the memory passes the first erasing verification according to the first erasing verification threshold; and when the current address of the memory is the predetermined address, the erasing module generates the flag, wherein the flag indicates that all addresses of the memory have passed the first erasing verification.

10. The memory device as claimed in claim 8, wherein the erasing module determines whether a current address of the memory passes a second erasing verification according to the second erasing verification threshold; when the current address of the memory does not pass the second erasing verification, the erasing module generates the at least one erasing pulse, corresponding to the erasing size, according to the erasing number so as to perform the erasing operation on the memory, when the current address of the memory passes the second erasing verification, the erasing module determines whether the current address of the memory is a predetermined address; when the current address of the memory is not the predetermined address, the erasing module changes the current address to a next address, and determines whether the current address of the memory passes the second erasing verification according to the second erasing verification threshold; when the current address of the memory is the predetermined address, the erasing module performs the over-erase correction on the memory.

11. The memory device as claimed in claim 8, wherein the erasing module determines whether the erasing number is lower than or equal to a first predetermined erasing number; when the erasing number is lower than or equal to the first predetermined erasing number, the erasing module generates a first erasing pulse corresponding to a first erasing size, so as to perform the erasing operation on the memory; the erasing module counts the first erasing pulse, so as to increase the erasing number; when the erasing number is not lower than or equal to the first predetermined erasing number, the erasing module determines whether the erasing number is lower than or equal to a second predetermined erasing number; when the erasing number is lower than or equal to the second predetermined erasing number, the erasing module generates a second erasing pulse corresponding to a second erasing size, so as to perform the erasing operation on the memory, and performs the over-erase correction on the memory; the erasing module counts the second erasing pulse, so as to increase the erasing number; when the erasing number is not lower than or equal to the second predetermined erasing number, the erasing module generates a third erasing pulse corresponding to a third erasing size, so as to perform the erasing operation on the memory, and performs the over-erase correction on the memory; the erasing module counts the third erasing pulse, so as to increase the erasing number.

12. The memory device as claimed in claim 11, wherein the second erasing size is smaller than the first erasing size, and the third erasing size is smaller than the second erasing size.

13. The memory device as claimed in claim 11, wherein the second predetermined erasing number is greater than the first predetermined erasing number.

14. The memory device as claimed in claim 8, wherein the first erasing verification threshold is lower than the second erasing verification threshold.

* * * * *